(12) United States Patent
Moon et al.

(10) Patent No.: US 6,653,160 B2
(45) Date of Patent: Nov. 25, 2003

(54) METHOD OF MANUFACTURING ARRAY SUBSTRATE FOR USE IN LIQUID CRYSTAL DISPLAY DEVICE

(75) Inventors: Kyo Ho Moon, Taegu (KR); Hu-Sung Kim, Seoul (KR)

(73) Assignee: LG. Philips LCD Co. LTD, Seoul (KR)

( * ) Notice: Subject to any disclaimer, the term of this patent is extended or adjusted under 35 U.S.C. 154(b) by 0 days.

(21) Appl. No.: 10/216,219

(22) Filed: Aug. 12, 2002

(65) Prior Publication Data

US 2002/0187574 A1 Dec. 12, 2002

Related U.S. Application Data

(63) Continuation-in-part of application No. 09/734,562, filed on Dec. 13, 2000.

(30) Foreign Application Priority Data

Dec. 13, 1999 (KR) ........................................ 1999-57330

(51) Int. Cl.⁷ ............................................... H01L 21/00
(52) U.S. Cl. .......................... 438/30; 438/153; 438/158
(58) Field of Search ........................... 438/30, 738–740, 438/736, 737, 153–158

(56) References Cited

U.S. PATENT DOCUMENTS 6,344,377 B2 * 2/2002 Ahn et al. .................. 438/158
6,465,285 B2 * 10/2002 Tokuhiro et al. ........... 438/153

* cited by examiner

*Primary Examiner*—D Le
(74) *Attorney, Agent, or Firm*—Birch, Stewart, Kolasch & Birch, LLP

(57) ABSTRACT

A method is disclosed for manufacturing an array substrate for use in a display device. The method includes providing a base substrate, forming a gate line on the base substrate using a first mask, forming sequentially a gate insulating layer, a semiconductor layer and a metal layer over the base substrate and the gate line, patterning the metal layer using a second mask to form a data line and a metal portion on the semiconductor layer, forming a protection layer over the data line, the metal portion and the semiconductor layer, forming a photoresist pattern on the protection layer over the data line using a third mask to define a first structure, applying at least two separate etching steps on the first structure to leave the gate insulating layer of a uniform thickness over the gate line and to pattern layers below the photoresist pattern, and forming a pixel electrode over a portion of the gate insulating layer on the gate line using a fourth mask.

20 Claims, 6 Drawing Sheets

METHOD OF MANUFACTURING ARRAY SUBSTRATE FOR USE IN LIQUID CRYSTAL DISPLAY DEVICE

CROSS REFERENCE

This application also is a Continuation-In-Part of U.S. patent application Ser. No. 09/734,562 filed on Dec. 13, 2000, the entire contents of which are herein fully incorporated by reference.

This application claims the benefit of Korean Patent Application No. 1999-57330 filed on Dec. 13, 1999, under 35 U.S.C. §119, the entire contents of which are herein fully incorporated by reference.

BACKGROUND OF THE INVENTION

1. Field of the Invention

The present invention relates to a liquid crystal display device, and more particularly, to a method of manufacturing the liquid crystal display device (LCD) with a four-masks process.

2. Description of Related Art

An LCD device has a lower substrate or array substrate having switching elements and pixel electrodes, and an upper substrate having a common electrode. Between the lower and upper substrates liquid crystal material is filled.

For more detailed explanation, the array substrate needs more processes than the upper substrate does. The switching element has a gate electrode, a source electrode, a drain electrode, and an active layer. The source electrode is extended from a data line and the gate electrode is extended from a gate line. The gate and data lines cross each other to form a matrix shape, and every region that is defined by crossing the gate and data lines is called a pixel region.

In order to form one layer of the array substrate, a deposition process, a photolithography process, and an etching process are needed. Sometimes, the photolithography process is said to include the deposition process and the etching process. For an array substrate, an insulating material, a semiconductor material, and a conductive material are used.

For the insulating material, a non-transparent material such as silicon nitride and silicon oxide, and a transparent polymer material such as benzocyclobutene (BCB) are used. For the active layer, there are two types: amorphous silicon and poly crystallized silicon. For the conductive material, aluminum, aluminum alloy, molybdenum, tantalum, and molybdenum-tungsten alloy are used.

A chemical vapor deposition method, a sputtering method and other methods are used in order to deposit the materials. For the etching process, a wet etching process and a dry etching process are used. The wet etching process is generally used for etching the conductive material for the gate and data lines and pixel electrode. The dry etching process is generally used for smaller and more accurate pattern such as active layer and insulating layer, and some conductive layers.

Since one mask process requires deposition and lithography and etching processes, it is necessary to reduce the number of masks for manufacturing the array substrate. Thus, recently the four-mask process is suggested. But, in this method, more than one layer should be etched, deteriorating uniformity of the etched layer.

Hereinafter, a manufacturing method for an array substrate is explained with reference to drawings.

FIG. 1 is a partial plane view of a typical array substrate for an LCD device. There is shown a thin film transistor "T" near the cross point of the data and gate lines 13 and 15, which also define the pixel region "P". There is also shown a storage capacitor "Cst" that must have a first electrode and a second electrode. The gate line 15 acts as the first electrode for the capacitor "C" and the pixel electrode 17 acts as the second electrode for the capacitor "Cst".

The storage capacitor "Cst" helps to maintain the transmitted signal to the liquid crystal material during between the transmitting signals. The storage capacitor is electrically parallel to the liquid crystal material. The storage capacitor can be formed as shown in FIG. 1 or independent of the gate line 15. The former is called storage capacitor-on-gate (Cst-on-Gate) structure, and the latter is called independent storage capacitor structure. These days the former structure shown in FIG. 1 is generally adopted.

FIGS. 2A to 2D are cross sectional views taken along line II—II of FIG. 1. These drawings illustrate a manufacturing process of the array substrate according to a related art.

As shown in FIG. 2A, in order to form a gate line 15, first a conductive material is deposited on the substrate 11 to form a first metal layer. The conductive material is chosen from a group consisting of aluminum, molybdenum, tungsten, and so on. Sometimes dual layer structure of aluminum and chrome or tungsten is adopted. On the entire first metal layer, a photoresist is coated. Then using a first mask having a gate line shape, the photoresist is exposed to light, and some of the photoresist is removed, leaving a portion of photoresist having a gate line pattern. Then, the first metal layer is etched to form a gate line and the remaining photoresist is removed.

FIG. 2B illustrates a second mask process. On the gate line 15 and the substrate, a gate insulating layer 19 made of a gate insulating layer, a semiconductor layer 21 made of a pure amorphous silicon layer, an ohmic contact layer, and a conductive material layer or second metal layer are formed and stacked sequentially. Then using a second mask, after the lithography process explained above with reference to FIG. 2A, the second metal layer is etched to form a data line 13 crossing the gate line 15 and a metal portion 13a having an island shape above the gate line 15. After that, the ohmic contact layer is etched to form an ohmic contact layer 22 having the same pattern as the data line 13 and the metal portion 13a.

FIG. 2C illustrates a third mask process. An insulating material is deposited on the whole substrate after the process shown in FIG. 2B to form a protection layer 23. Then using a third mask, photoresist 27 is only left over the data line 13 and over a portion for a thin film transistor "T" (see FIG. 1). Thus, portions of the array substrate can be divided into three portions: "A" portion having the photoresist 27 and other layers; "B" portion having a sectional structure composed of the gate insulating layer 19, semiconductor layer 21 and protection layer 23; and "C" portion having a sectional structure composed of the gate line 15, gate insulating layer 19, semiconductor layer 21, ohmic contact layer 22, metal portion 13a and protection layer 23. As can be imagined from FIG. 1, "A" portion corresponds to a data line portion, "B" portion to a pixel region "P", and "C" portion to a storage capacitor portion "Cst".

As shown in FIG. 2D, using the photoresist 27, "A", "B", and "C" portions are all etched at the same time with only a single etching gas using a dry etching method. As a result, at "A" portion, the layers 23, 22, 21, 13, and 19 under the photoresist 27 are left; at "B" portion, no layer is left; and at "C" portion, the gate insulating layer 19a having a non-uniform thickness "t" is left due to the etching rate and metal portion 13a shown in FIG. 2C. The gate insulating layer 19a on the gate line 15 acts as a dielectric layer of the storage capacitor "C" (see FIG. 1).

However, since multiple layers are simultaneously etched at one time using a single etching gas and the gate insulating layer should remain on the gate line 15, the remaining gate insulating layer 19a cannot have a uniform thickness throughout the whole pixel regions "P" (see FIG. 1) and/or their boundaries and cannot have a smooth surface as shown in FIG. 2D. Thus the capacitance of the capacitor "Cst" varies according to the position of the pixel region and the property of the capacitor is degraded due to a surface roughness of the gate insulating layer 19a, which results in deteriorating display quality of the LCD device.

SUMMARY OF THE INVENTION

To overcome the problems described above, preferred embodiments of the present invention provide a method of manufacturing an array substrate for use in a liquid crystal display device which can make storage capacitor on the gate line have a uniform capacitance independent of the position of the pixel region.

Preferred embodiments of the present invention further provide another method of manufacturing an array substrate for use in a liquid crystal display device having a short processing time and a high manufacturing yield.

In order to achieve the above objects, the preferred embodiment of the present invention provides a method of manufacturing an array substrate for use in a liquid crystal display device, including: providing a substrate; forming a gate line on the substrate using a first mask; forming sequentially a gate insulating layer, a semiconductor layer, a doped semiconductor layer, and a metal layer on the whole substrate while covering the gate line; forming a data line and an island shaped metal portion with the doped semiconductor layer on the semiconductor layer over the gate line by patterning the metal layer using a second mask; forming a protection layer on the semiconductor layer while covering the data line and the island shaped metal portion; forming a photoresist pattern on the protection layer over the data line using a third mask to define a first interstructure; etching the first interstructure using the photoresist pattern to leave the photoresist and the layers under the the photoresist over the data line and to leave the etched semiconductor layer and the gate insulating layer over the gate line to define a second interstructure; etching the second interstructure to leave the gate insulating layer on the gate line; and forming a pixel electrode covering a portion of the gate insulating layer on the gate line using a fourth mask.

In an another aspect of the invention, the preferred embodiment of the present invention further provides a method of manufacturing an array panel for use in a liquid crystal display device, including: providing a substrate; forming a gate line on the substrate using a first mask; forming sequentially a gate insulating layer, a semiconductor layer, a doped semiconductor layer, and a metal layer on the whole substrate while covering the gate line; forming a data line and an island shaped metal portion with the doped semiconductor layer on the semiconductor layer over the gate line by patterning the metal layer using a second mask; forming a protection layer on the semiconductor layer while covering the data line and the island shaped metal portion; forming a photoresist pattern on the protection layer over the data line using a third mask to define a first interstructure; etching the first interstructure using the photoresist pattern to leave the photoresist, the layers under the photoresist over the data line and to leave the island shaped metal portion, the doped semiconductor layer, the semiconductor layer, and the gate insulating layer over the gate line to define a second interstructure; etching the second interstructure to leave the semiconductor layer and the gate insulating layer on the gate line to define a third interstructure; etching the third interstructure to remove the semiconductor layer and the gate insulating layer on the gate line; and forming a pixel electrode covering a portion of the gate insulating layer on the gate line using a fourth mask.

BRIEF DESCRIPTION OF THE DRAWINGS

For a more complete understanding of the present invention and the advantages thereof, reference is now made to the following descriptions taken in conjunction with the accompanying drawings, in which like reference numerals denote like parts, and in which.

DETAILED DESCRIPTION OF PREFERRED EMBODIMENTS

Reference will now be made in detail to the preferred embodiments of the present invention, example of which is illustrated in the accompanying drawings.

A first embodiment of the invention suggests a method of forming a uniform dielectric layer by adopting two etching steps at a third mask process.

Figure 2A:
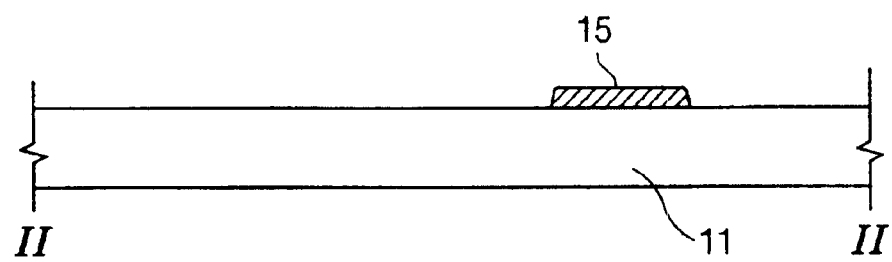
FIGS. 2A to 2D are cross sectional views, illustrating conventional progress steps for manufacturing the array substrate of FIG. 1, taken along line II—II of FIG. 1.
Figure 2B:
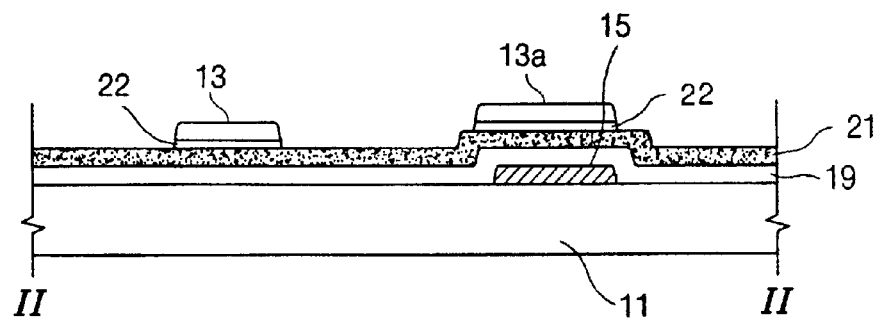
Figure 2C:
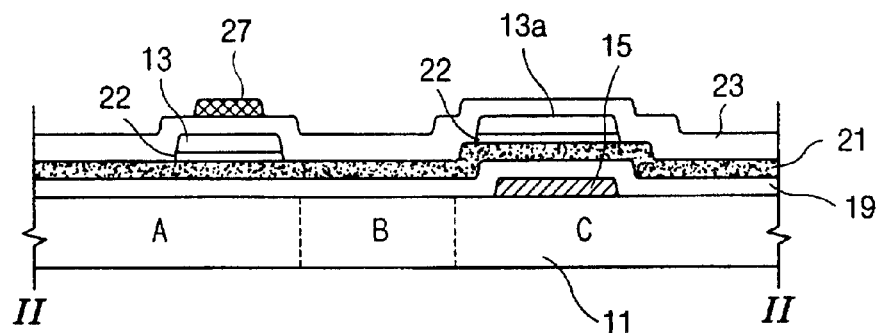
Figure 2D:
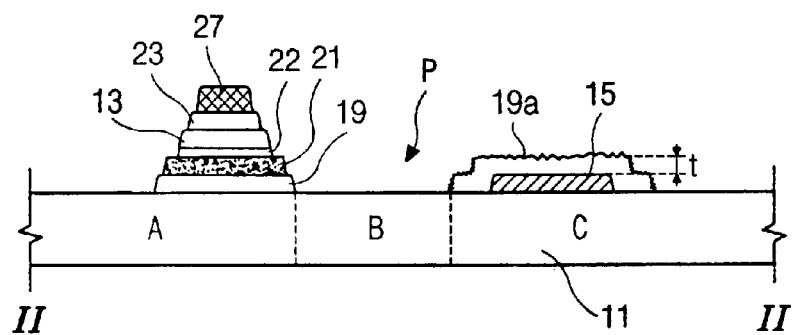
Figure 3A:
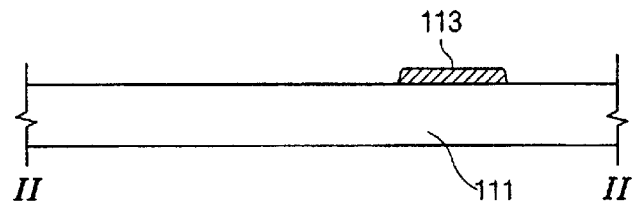
FIGS. 3A to 3F are cross sectional views, illustrating progress steps for manufacturing the array substrate according to a first embodiment of the invention, taken along line II—II of FIG. 1.
Figure 3B:
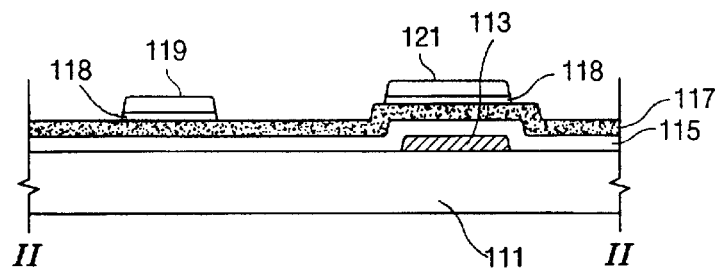
Figure 3C:
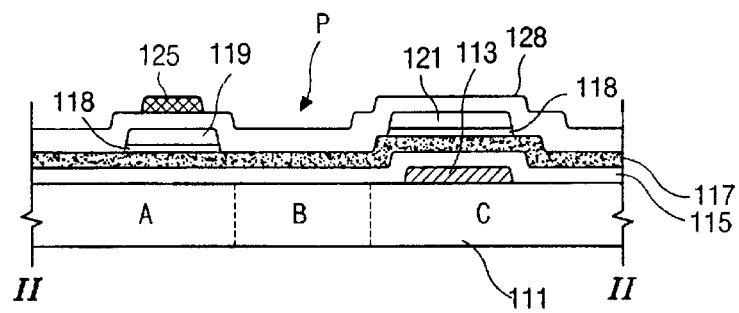

FIGS. 3A to 3F illustrate a method of manufacturing an array substrate for an LCD device according to the first embodiment of the present invention. The processes illustrated in FIGS. 3A to 3C are identical to those illustrated in FIGS. 2A to 2C, and thus the detail description is omitted and a brief description is provided below.

As shown in FIGS. 3A to 3C, on a substrate 111, a metallic or conductive material is deposited to form a first metal layer. The conductive material may be chosen from aluminum, molybdenum, tungsten, and so on. Sometimes, a combination or mixture of known conductive materials such as a dual layer of aluminum and chrome/tungsten may be used. Next, using a first mask and through a photolithography process, a gate line 113 is formed. Next, a gate insulating layer 115, a semiconductor layer 117 (e.g., made of pure amorphous silicon), a doped semiconductor layer (ohmic contact layer) and a second metal layer are formed sequentially on the whole substrate 111 while covering the gate line 113. The second metal layer is formed of a metallic material such as molybdenum or tantalum, which can be etched by a dry etching technique. Through a second mask process, the second metal layer and the doped semiconductor layer are patterned to form a data line 119, an island shaped metal portion 121 and a doped semiconductor layer 118 over the gate line 113. The thickness of the metal portion 121 here may be less than a predetermined value which may be, e.g., 1300 Å. Next, a protection layer 128 of an insulating material is formed on the semiconductor layer 117 while covering the data line 119 and the metal portion 121.

Next, photoresist is deposited on the protection layer 128 and using a third mask, a portion 125 of the photoresist over the data line 119 remains. Thus, portions of the array substrate can be divided into three portions: "A" portion having the photoresist portion 125, protection layer 128, data line 119, doped semiconductor layer 118, semiconductor layer 117 and gate insulating layer 115; "B" portion having a sectional structure composed of the gate insulating layer 115, semiconductor layer 117 and protection layer 128; and "C" portion having a sectional structure composed of the gate line 113, gate insulating layer 115, semiconductor layer 117, doped semiconductor layer 118, metal portion 121 and protection layer 128.

The metal portion 121 is used to adjust etching rate and to remain the gate insulating layer 115 only on the gate line 113, similar to the use of the metal portion 13a of FIG. 2C.

Figure 3D:
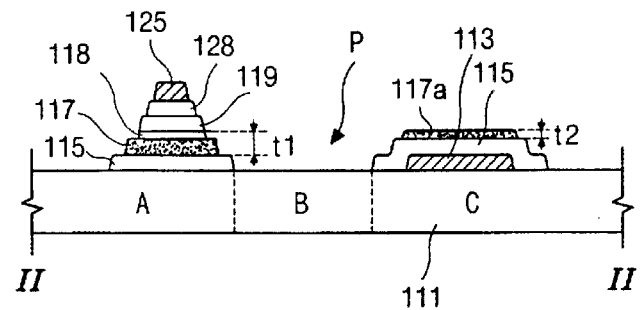

FIG. 3D shows a result of a first etching step that is performed using a first etching gas during the third mask process in order to remain only one layer on the gate insulating layer 115. In this step, a dry etching technique is adopted. By controlling the amount of the first etching gas, etching time, etching constitution and the like, at "B" portion, no layer is left; at "A" portion, portions of the layers under the photoresist 125 remain; and at "C" portion, a semiconductor layer 117a having a thickness t2 is left on the gate insulating layer 115. At portion "A", since the photoresist 125 functions as an etch stopper and thereby shields the layers underneath it, all the layers 128, 119, 118, 117 and 115 under the photoresist 125 remain while the layers of the portions "B" and "C" are etched.

Here, the first etching gas may be composed of sulfur hexafluoride ($SF_6$), oxygen ($O_2$) and helium (He). More than 45 mol % of the first etching gas may constitute an oxygen gas. As an example of an etching condition usable in this first etching step, a mixture of $SF_6$, $O_2$ and He in the following flow rate/amounts is used: $SF_6$=125 sccm, $O_2$=400 sccm, and He=250 sccm. Other examples are possible. Generally, the etching time can be determined according to the partial pressure of the etching. One skilled in the art would readily appreciate that the etching time varies with the process condition and an appropriate etching time can be selected. The molar ratio of $SF_6$ to $O_2$ in the first etching gas usable in the first etching step is more than 1:3.

After the first etching step, the thickness t2 of the semiconductor layer 117a on the gate insulating layer 115 at portion "C" is smaller than that of the semiconductor layer 117 under the photoresist 125 at portion "A". The former is half of the latter, for example, whose thickness can be adjusted if needed by controlling the etching condition.

Figure 3E:
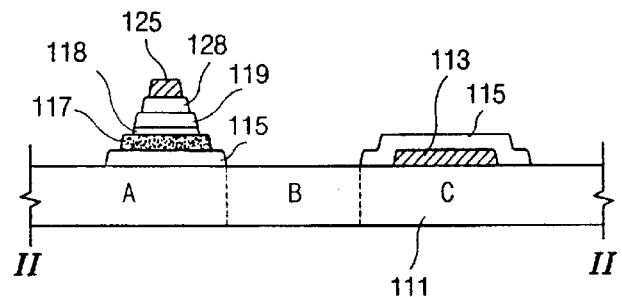

Next, as shown in FIG. 3E, a second etching step is performed using a different second etching gas, wherein only the semiconductor layer 117a on the gate insulating layer 115 is etched using the second etching gas having a big etching selection ratio between the semiconductor layer 117 and the gate insulating layer 115. The second etching gas may be composed of $SF_6$, $O_2$, and hydrochloric (HCl) gas. More than 45 mol % of the second etching gas may constitute a hydrochloric (HCl) gas. For instance, in the second etching step, a mixture of $SF_6$, $O_2$ and HCl in the following flow rate/amounts is used to produce the structure as shown in FIG. 3E: $SF_6$=200 sccm, $O_2$=300 sccm, and HCl=300 sccm. Other examples are possible. The molar ratio of $SF_6$ to HCl in the second etching gas usable in the second etching step is more than 1:1.

Figure 1:
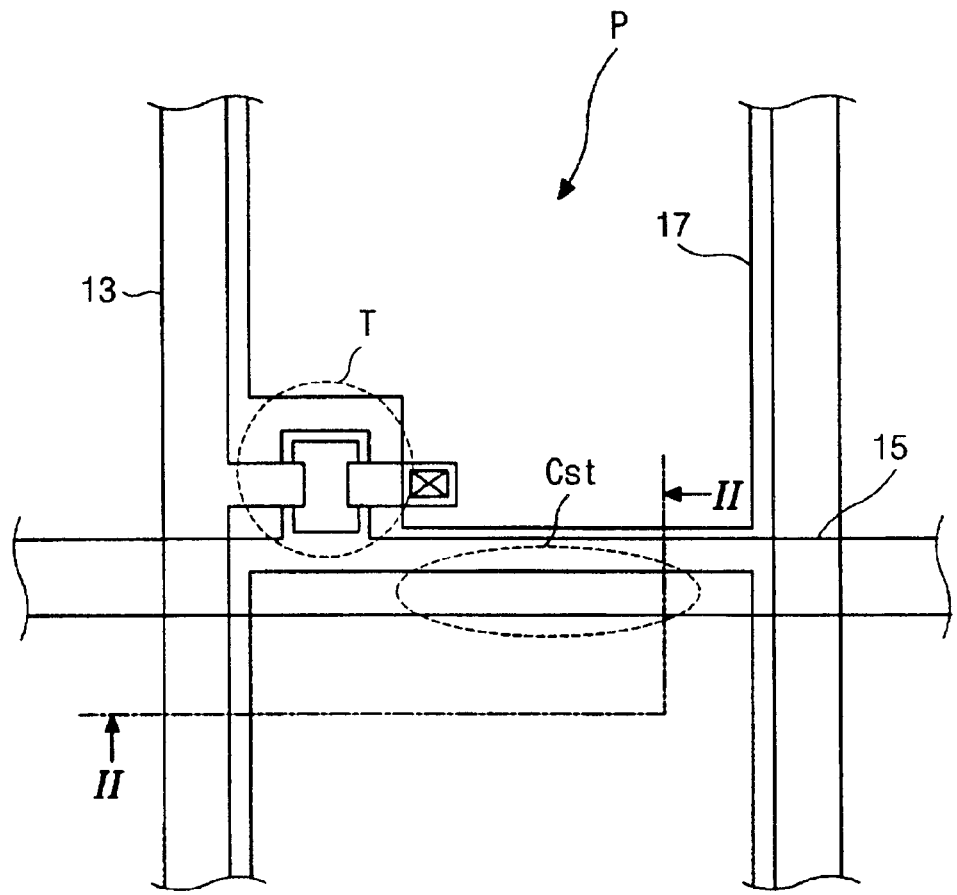
FIG. 1 is a partial plan view illustrating a typical array substrate for a liquid crystal display (LCD) device.

In this second etching step, only one layer is etched, thus it is easy to get the gate insulating layer 115 having a uniform thickness. Since the gate insulating layer 115 acts as a dielectric layer for capacitor, the uniform thickness of the gate insulating layer 115 (portion "C") on the gate line 113 independent of the position of the pixel region leads to a constant capacitance of the capacitor "Cst" (see FIG. 1) for the LCD device throughout the whole pixel regions "P". The second etching step completes the third mask process in the first embodiment.

Figure 3F:
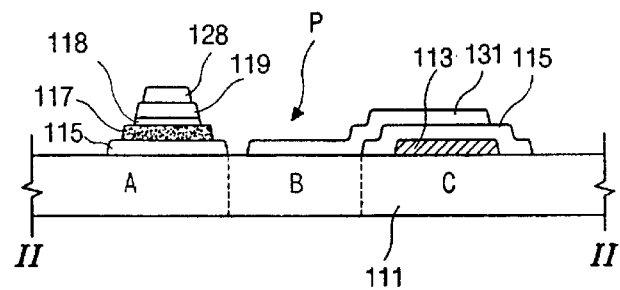

After the third mask process, as shown in FIG. 3F, a transparent conductive material is deposited on the whole substrate, and using a fourth mask a pixel electrode 131 is formed. The pixel electrode is connected to the thin film transistor "T" (see FIG. 1). The pixel electrode also 131 acts as one electrode for the capacitor "Cst", while the gate line 113 acts as the other electrode for the capacitor "Cst".

A second embodiment of the invention suggests using three (first, second and third) etching steps during the third mask process.

Figure 4A:
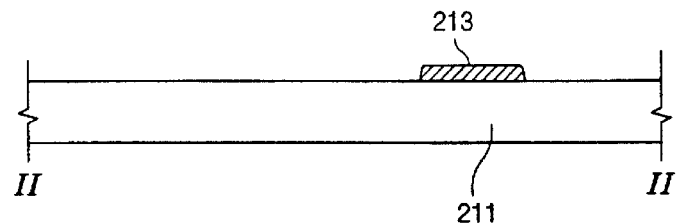
FIGS. 4A to 4G are cross sectional views, illustrating progress steps for manufacturing the array substrate according to a second embodiment of the invention, taken along line II—II of FIG. 1.
Figure 4B:
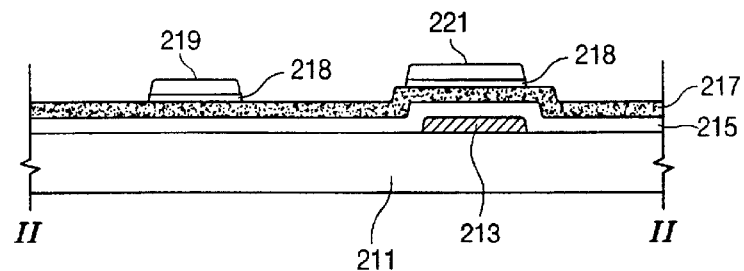
Figure 4C:
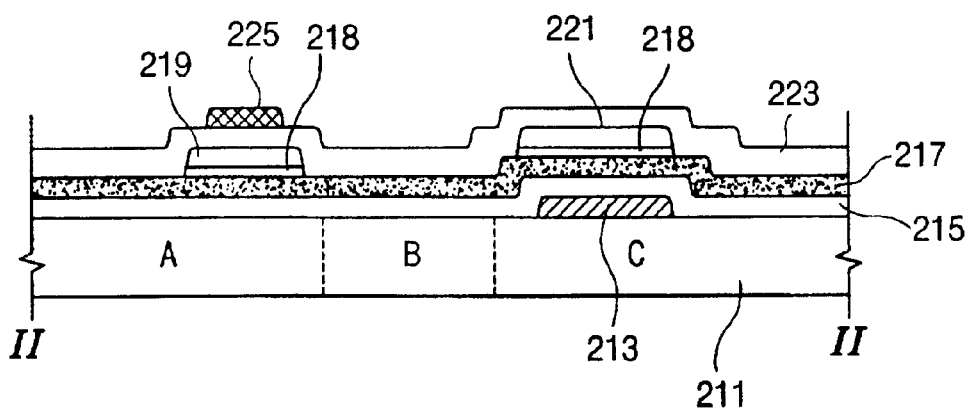

FIGS. 4A to 4G illustrate a method of manufacturing an array substrate for an LCD device according to a second embodiment of the invention. The processes illustrated in FIGS. 4A to 4C are identical to those illustrated in FIGS. 3A to 3C, and thus the detailed description is omitted and a brief description is provided.

As shown in FIGS. 4A to 4C, on a substrate 211, a conductive material is deposited to form a first metal layer.

Next, using a first mask and through a photolithography process, a gate line 213 is formed. Next, a gate insulating layer 215, a semiconductor layer 217 (e.g., formed of pure amorphous silicon), a doped semiconductor layer, and a second metal layer are formed sequentially on the whole substrate 211 while covering the gate line 213. The second metal layer may be formed of a metallic material such as molybdenum or tantalum, which can be etched by a dry etching technique.

Through a second mask process, the second metal layer and the doped semiconductor layer are patterned to form a data line 219, an island shaped metal portion 221 and a doped semiconductor layer 218 over the gate line 213. The thickness of the metal portion 221 is greater than a predetermined value which may be, e.g., 1300 Å. At this time, the data line 219 must have the wider width than that should be made finally. That is, the data line 219 has a surplus margin in width. The margin helps to prevent the layers under the data line from over etching.

Next, a protection layer 223 of an insulating material is formed on the semiconductor layer 217 while covering the data line 212 and the metal portion 221.

Next, photoresist is deposited on the protection layer 223 and using a third mask, a portion 225 of the photoresist over the data line 219 remains. Thus, portions of the array substrate can be divided into three portions: "A" portion having the photoresist portion 225, protection layer 223, data line 219, doped semiconductor layer 218, semiconductor layer 217 and gate insulating layer 215; "B" portion having a sectional structure composed of the gate insulating layer 215, semiconductor layer 217 and protection layer 223; and "C" portion having a sectional structure composed of the gate line 213, gate insulating layer 215, semiconductor layer 217, doped semiconductor layer 218, metal portion 221 and protection layer 223.

The metal portion 221 is used to adjust etching rate and to remain the gate insulating layer 215 only on the gate line 213, similar to the use of the metal portion 121 of FIG. 3C.

Figure 4D:
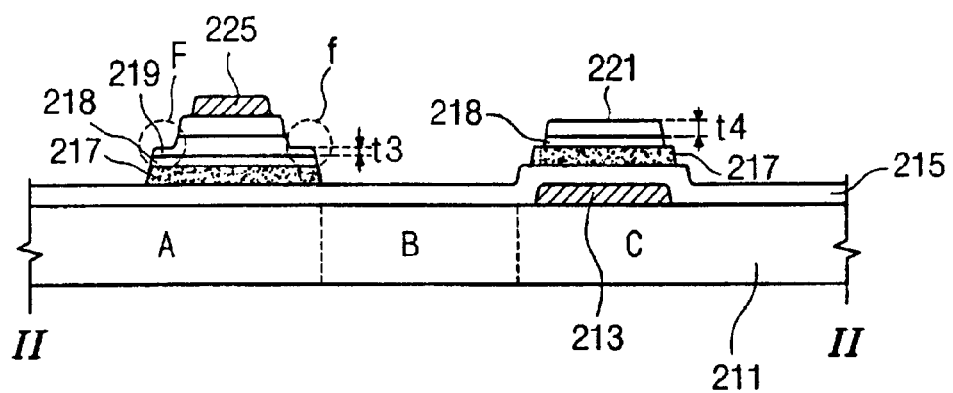

Next, using the photoresist 225, three (first, second and third) separate etching steps are performed. More specifically, FIG. 4D illustrates a first etching step performed using a first etching gas. In the first etching step, while etching the protection layer 223 and the semiconductor later 217 at "B" portion, the protection layer 223 and the metal portion 221 at "A" portion are etched. Since the photoresist 225 functions as an etch stopper, the photoresist 225 shields all the layers underneath it so that all the layers 223, 219, 218 and 217 remain while the layers at "B" and "C" portions are etched. After the first etching step, the metal portion 221 can have about one-half thickness "t4" of the thickness before the first etching step. At portion "A", as discussed above, the layers under the photoresist 225 remain and the surplus margin "f" of the data line 219 has about one-half thickness "t3" of the previous thickness.

For this purpose, the first etching gas used in the first etching step can be chosen such that it can etch the protection layer 223 and the semiconductor layer 217 in a larger amount and faster than the metal portion 221. In the alternative, it is possible to increase the thickness of the metal portion 221 to a certain thickness, for example over 1300 Å, so that etching of layers under the metal portion 221 is prevented. The first etching gas may be composed of sulfur hexafluoride ($SF_6$), oxygen ($O_2$) and helium (He). Or if the metal portion 221 is made of some metal materials such as molybdenum, less than 30 mol % of the first etching gas can constitute an oxygen gas. For instance, in this first etching step, a mixture of $SF_6$, $O_2$ and He in the following flow rate/amounts is used to produce the structure as shown in FIG. 4D: $SF_6$=300 sccm, $O_2$=0~90 sccm, and He=300 sccm. Other examples are possible. The molar ratio of $SF_6$ to $O_2$ in the first etching gas usable in this first etching step is less than 3:1. After the first etching step, the gate insulating layer 215 remains.

Figure 4E:
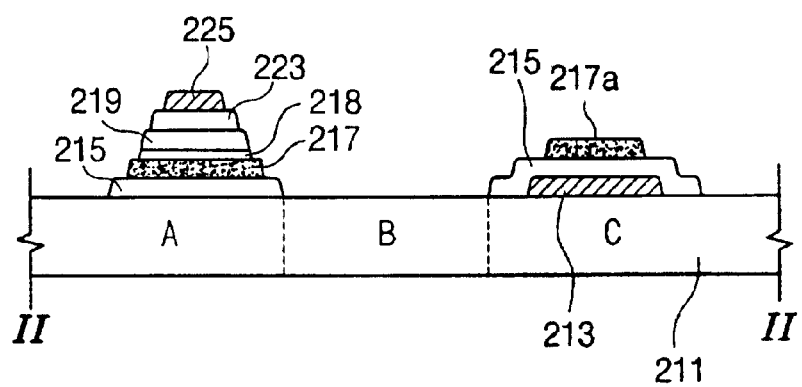

FIG. 4E shows the state of the array substrate after a second etching step. In this second etching step performed using a second etching gas, while etching the gate insulating layer 215 at portion "B", at portion "C" the metal portion 221 and the doped semiconductor layer 218 are fully etched and the semiconductor layer 217 is somewhat, for example half, etched to produce a semiconductor layer portion 217a, and at portion "A" the surplus margin "f" of the data line 219 and the under-positioned layers (e.g., the layer 218) are etched. The etching condition can be controlled as describe before. That is, the second etching gas may be composed of sulfur hexafluoride ($SF_6$), oxygen ($O_2$) and helium (He). More than 45 mol % of the second etching gas may constitute an oxygen gas. As an example of an etching condition usable in this second etching step, a mixture of $SF_6$, $O_2$ and He in the following flow rate/amounts is used: $SF_6$=125 sccm, $O_2$=400 sccm, and He=250 sccm. Other examples are possible. The molar ratio of $SF_6$ to $O_2$ in the second etching gas usable in the second etching step is more than 1:3.

Figure 4F:
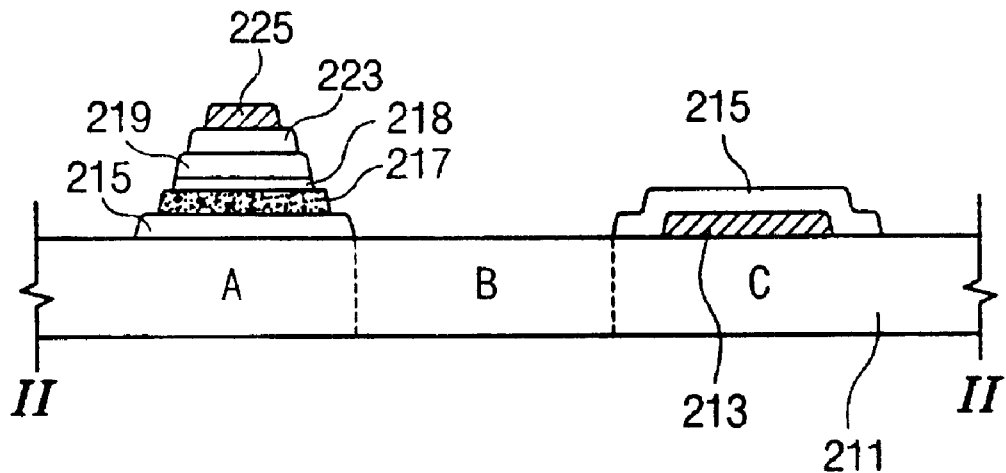

FIG. 4F shows the state of the array substrate after a third etching step. In this third etching step that is performed using a third etching gas, only the semiconductor layer portion 217a at portion "C" shown in FIG. 4E is fully etched and the gate insulating layer 215 on the gate line 213 remains. As discussed above in the first embodiment in connection with FIG. 3E, the third etching gas has an etching selectivity between the semiconductor layer portion 217a and the gate insulating layer 215. In this etching step, only one layer is etched, thus it is easy to get the gate insulating layer having a uniform thickness. Since the gate insulating layer 215 acts as a dielectric layer for a capacitor, a uniform thickness of the gate insulating layer 215 on the gate line 213 independent of the position of the pixel region leads to a constant capacitance of the capacitor "Cst" (see FIG. 1) for the LCD device throughout the whole pixel regions "P". The third etching gas may be composed of $SF_6$, $O_2$, and hydrochloric (Hcl) gas. More than 45 mol % of the third etching gas may constitute a hydrochloric (Hcl) gas. For instance, in this third etching step, a mixture of $SF_6$, $O_2$ and Hcl in the following flow rate/amounts is used to produce the structure as shown in FIG. 4F: $SF_6$=200 sccm, $O_2$=300 sccm, and Hcl=300 sccm. Other examples are possible. The molar ratio of $SF_6$ to Hcl in the third etching gas usable in this third etching step is more than 1:1. The third etching step completes the third mask process in the second embodiment.

Figure 4G:
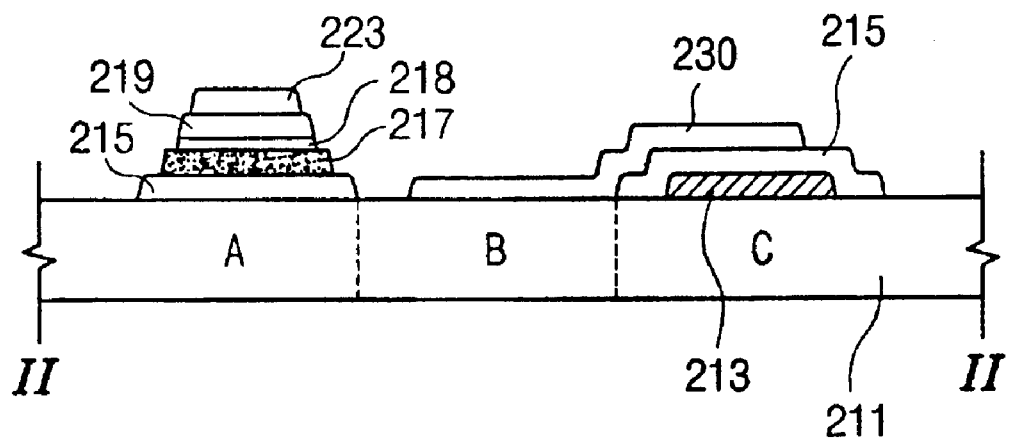

After the third mask process, as shown in FIG. 4G, a transparent conductive material is deposited on the whole substrate, and using a fourth mask a pixel electrode 230 is formed. The pixel electrode is connected to the thin film transistor "T" (see FIG. 1). The pixel electrode also 230 acts as one electrode for the capacitor "Cst", while the gate line 213 acts as the other electrode for the capacitor "Cst".

In the first and second embodiments of the present invention, the first, second and third etching gases can be composed of other etching gases for providing the etching results as described above, and are different from each other in properties as discussed above. The second embodiment is an example when the thickness of the metal portion layer 221 in FIG. 4C is more than about 1300 Å. Thus, after the first etching step, the metal portion 221 of a reduced thickness t4 remains while the semiconductor layer 217 is eliminated at portion "B".

As explained above, according to the invention, a constant capacitance throughout the pixel regions can be obtained using only four masks, the display quality cannot be deteriorated in condition of four mask manufacturing method of low production cost.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A method of manufacturing an array panel for use in a liquid crystal display device, comprising:

providing a substrate;

forming a gate line on the substrate using a first mask;

forming sequentially a gate insulating layer, a first semiconductor layer, a second semiconductor layer, and a metal layer on the whole substrate while covering the gate line;

forming a data line and an island shaped metal portion on the second semiconductor layer over the gate line by patterning the metal layer using a second mask;

forming a protection layer over the first semiconductor layer while covering the data line and the island shaped metal portion;

forming a photoresist pattern on the protection layer over the data line using a third mask to define a first interstructure;

first etching the first interstructure using the photoresist pattern and using a first etching gas, whereby the photoresist pattern and the layers under the photoresist pattern remain over the data line, and the first semiconductor layer of a reduced thickness and the gate insulating layer remain on the gate line, wherein the remaining layers define a second interstructure;

second etching the second interstructure using a second etching gas to leave the gate insulating layer on the gate line, the second etching gas having an etching selectivity between the semiconductor layer and the gate insulating layer; and forming a pixel electrode covering a portion of the gate insulating layer on the gate line using a fourth mask.

2. The method of claim 1, wherein the thickness of the portion of the first semiconductor layer left on the gate line after the first etching has one-half thickness of the first semiconductor layer under the data line.

3. The method of claim 1, wherein the first and second etchings are processed using a dry etching technique.

4. The method of claim 1, wherein the data line has a metallic material chosen from a group consisting of molybdenum, tantalum, and titanium.

5. The method of claim 1, wherein at least one of the following is satisfied:

the first etching gas is composed of $SF_6$, $O_2$ and He; and the second etching gas is composed of $SF_6$, $O_2$ and Hcl.

6. The method of claim 1, wherein at least one of the following is satisfied:

for the first etching gas, $SF_6$=125 sccm, $O_2$=400 sccm, and He=250 seem are used; and for the second etching gas, $SF_6$=200 sccm, $O_2$=300 sccm, and Hcl=300 sccm are used.

7. A method of manufacturing an array panel for use in a liquid crystal display device, comprising:

providing a substrate;

forming a gate line on the substrate using a first mask;

forming sequentially a gate insulating layer, a first semiconductor layer, a second semiconductor layer, and a metal layer on the substrate while covering the gate line;

forming a data line and an island shaped metal portion on the second semiconductor layer over the gate line by patterning the metal layer using a second mask;

forming a protection layer over the first semiconductor layer while covering the data line and the island shaped metal portion;

forming a photoresist pattern on the protection layer over the data line using a third mask to define a first interstructure;

first etching the first interstructure using the photoresist pattern and using a first etching gas to leave the photoresist pattern and the layers under the photoresist pattern over the data line and to leave the island shaped metal portion of a reduced thickness, the first and second semiconductor layers and the gate insulating layer over the gate line to define a second interstructure, the first etching gas having a faster etching rate toward the gate insulating layer and the semiconductor layer than toward the metal layer;

second etching the second interstructure using a second etching gas to remove the second semiconductor layer and to leave the first semiconductor layer and the gate insulating layer on the gate line to define a third interstructure;

third etching the third interstructure using a third etching gas to remove the first semiconductor layer from the gate line, the third etching gas having an etching selectivity between the semiconductor layer and the gate insulating layer; and forming a pixel electrode covering a portion of the gate insulating layer on the gate line using a fourth mask.

8. The method of claim 7, wherein, after the second etching step, the first semiconductor layer remaining on the gate line has one-half thickness of the first semiconductor layer under the data line.

9. The method of claim 7, wherein the first, second and third etchings are processed using a dry etching technique.

10. The method of claim 7, wherein the data line has a metallic material chosen from a group consisting of molybdenum, tantalum, and titanium.

11. The method of claim 7, wherein the data line has a thickness over 1300 Å.

12. The method of claim 7, wherein at least one of the following is satisfied:

the first etching gas is composed of $SF_6$, $O_2$ and He;

the second etching gas is composed of $SF_6$, $O_2$ and He; and the third etching gas is composed of $SF_6$, $O_2$ and Hcl.

13. The method of claim 7, wherein at least one of the following is satisfied:

for the first etching gas, $SF_6$=300 sccm, $O_2$32 0~90 sccm, and He=300 sccm are used;

for the second etching gas, $SF_6$=125 sccm, $O_2$=400 sccm, and He=250 sccm are used; and for the third etching gas, $SF_6$=200 sccm, $O_2$=300 sccm, and Hcl=300 sccm are used.

14. The method of claim 7, wherein the data line is formed of molybdenum and the first etching gas is composed of an oxygen gas at less than 30 mol % of the entire first etching gas.

15. A method of manufacturing an array substrate for use in a display device, the method comprising:

providing a base substrate;

forming a gate line on the base substrate using a first mask;

forming sequentially a gate insulating layer, first and second semiconductor layers and a metal layer over the base substrate and the gate line;

patterning the metal layer using a second mask to form a data line and a metal portion on the second semiconductor layer;

forming a protection layer over the data line, the metal portion and the first semiconductor layer;

forming a photoresist pattern on the protection layer over the data line using a third mask to define a first structure;

applying at least two separate etching steps on the first structure using at least two different etching gases, so as to leave the gate insulating layer of a uniform thickness over the gate line and to pattern layers below the photoresist pattern; and forming a pixel electrode over a portion of the gate insulating layer on the gate line using a fourth mask.

16. The method of claim 15, wherein the applying step includes:

first etching, using a first etching gas, the first structure to leave a layered structure on the data line and to leave both the first semiconductor layer of a reduced thickness and the gate insulating layer over the gate line to define a second structure; and second etching, using a different second etching gas, the first semiconductor layer to leave only the gate insulating layer of a uniform thickness over the gate line.

17. The method of claim 15, wherein the applying step includes:

first etching, using a first etching gas, the first structure using the photoresist pattern to leave the photoresist pattern and the layers under the photoresist pattern over the data line and to leave the metal portion of a reduced thickness, the second semiconductor layer of an initial thickness, the first semiconductor layer of an initial thickness and the gate insulating layer of an initial thickness over the gate line to define a second structure;

second etching, using a second etching gas, the second structure to leave only the first semiconductor layer and the gate insulating layer on the gate line to define a third structure; and third etching, using a third etching gas, the third structure to remove entirely the first semiconductor layer from the gate line so that the gate insulating layer of a uniform thickness remains over the gate line.

18. The method of claim 15, wherein the data line has a metallic material selected from a group of molybdenum, tantalum, and titanium.

19. The method of claim 15, wherein, in the at least two separate etching steps applied in the applying step, first and second different etching gases are used, and wherein at least one of the following is satisfied:

the first etching gas is composed of $SF_6$, $O_2$ and He; and the second etching gas is composed of $SF_6$, $O_2$ and Hcl.

20. The method of claim 15, wherein, in the at least two separate etching steps applied in the applying step, first, second and third etching gases are used, and wherein at least one of the following is satisfied:

for the first etching gas, $SF_6$=300 sccm, $O_2$=0~90 sccm, and He=300 sccm are used;

for the second etching gas, $SF_6$=125 sccm, $O_2$=400 sccm, and He=250 sccm are used; and for the third etching gas, $SF_6$=200 seem, $O_2$=300 sccm, and Hcl=300 sccm are used.

* * * * *